United States Patent
Sturm et al.

(10) Patent No.: US 10,211,697 B2
(45) Date of Patent: Feb. 19, 2019

(54) COVER DEVICE FOR AN ELECTRONICS HOUSING OF AN ELECTRIC MOTOR

(71) Applicant: ebm-papst Mulfingen GmbH & Co. KG, Mulfingen (DE)

(72) Inventors: Michael Sturm, Bad Mergentheim (DE); Thomas Sauer, Bad Mergentheim (DE)

(73) Assignee: EBM-PAPST MULFINGEN GMBH & CO. KG, Mulfingen (DE)

(*) Notice: Subject to any disclaimer, the term of this patent is extended or adjusted under 35 U.S.C. 154(b) by 186 days.

(21) Appl. No.: 15/368,097

(22) Filed: Dec. 2, 2016

(65) Prior Publication Data

US 2017/0163122 A1    Jun. 8, 2017

(30) Foreign Application Priority Data

Dec. 4, 2015 (DE) .................. 10 2015 121 166

(51) Int. Cl.
*H02K 5/20* (2006.01)
*H02K 7/14* (2006.01)
(Continued)

(52) U.S. Cl.
CPC ............ *H02K 5/20* (2013.01); *H02K 5/18* (2013.01); *H02K 7/14* (2013.01); *H02K 9/02* (2013.01);
(Continued)

(58) Field of Classification Search
CPC ............ H02K 5/20; H02K 11/33; H02K 5/18; H02K 7/14; H02K 9/02; H02K 11/0094; H05K 5/03; H05K 7/20145
See application file for complete search history.

(56) References Cited

U.S. PATENT DOCUMENTS

| 8,760,017 B2 * | 6/2014 | Henke ................ H02K 11/33 |
| | | 310/62 |
| 2008/0193275 A1 * | 8/2008 | De Filippis ............ H02K 1/276 |
| | | 415/10 |

(Continued)

FOREIGN PATENT DOCUMENTS

DE     103 13 273 A1   10/2004
DE  10 2009 044 240 A1    7/2010
(Continued)

OTHER PUBLICATIONS

European Search Report for International Applicatoin No. EP 16 20 0878 dated May 19, 2017.

*Primary Examiner* — Emily P Pham
(74) *Attorney, Agent, or Firm* — Brinks Gilson & Lione (57) ABSTRACT

The invention concerns a cover device for an electronics housing of an electric motor with at least one base segment and at least one rib formed on the base segment, wherein the base segment is geometrically configured so as to cover at least part of the surface of an electronics housing opening for drawing in a cooling air volume flow in order to close the electronics housing opening at least for a portion against the intrusion of solids, and the base segment forms with the at least one rib at least one flow duct, which can be fluidically connected to the electronics housing opening, and wherein the cover device is designed as a modular insert for the electronics housing.

15 Claims, 8 Drawing Sheets

(51) Int. Cl.
  *H02K 9/02* (2006.01)
  *H02K 11/33* (2016.01)
  *H02K 5/18* (2006.01)
  *H02K 11/00* (2016.01)
  *H05K 5/03* (2006.01)
  *H05K 7/20* (2006.01)

(52) U.S. Cl.
  CPC ......... *H02K 11/0094* (2013.01); *H02K 11/33* (2016.01); *H05K 5/03* (2013.01); *H05K 7/20145* (2013.01)

(56) References Cited

U.S. PATENT DOCUMENTS

| | | |
|---|---|---|
| 2011/0074235 A1 | 3/2011 | Leung et al. |
| 2014/0252898 A1* | 9/2014 | Sauer ........................ H02J 7/00 310/88 |
| 2014/0292163 A1 | 10/2014 | Lau et al. |
| 2014/0325789 A1 | 11/2014 | Hill et al. |
| 2015/0145382 A1* | 5/2015 | Sturm ................... F04D 25/068 310/60 A |
| 2015/0263591 A1 | 9/2015 | Maschke et al. |
| 2017/0163122 A1 | 6/2017 | Sturm et al. |

FOREIGN PATENT DOCUMENTS

| | | |
|---|---|---|
| DE | 10 2012 107 109 A1 | 2/2014 |
| DE | 10 2014 104 069 A1 | 10/2014 |
| DE | 10 2015 121 166 A1 | 6/2017 |
| EP | 1622244 A1 | 2/2006 |

* cited by examiner

COVER DEVICE FOR AN ELECTRONICS HOUSING OF AN ELECTRIC MOTOR

RELATED APPLICATIONS

The present patent document claims the benefit of priority to German Patent Application No. 102015121166.1, filed Dec. 4, 2015, the entire contents of which are incorporated herein by reference.

FIELD

The present invention concerns a cover device for an electronics housing of an electric motor. The electronics housing accommodates the motor electronics along which extends a cooling air duct which is integrated into the electronics housing.

BACKGROUND

Electric motors from the field of the present invention are used especially to power fans. They are generally mounted via the stator bushing on fastening walls or load-bearing structures, which makes an effective cooling difficult. The power range and the service life of the electric motor are dictated among other things also by the component temperatures achieved in operation, especially that of the integrated motor electronics, electrical power components, bearing and motor drive unit components. For this reason, an adequate and long-lasting cooling of the components is of great importance.

SUMMARY

It is known from the prior art, such as DE 10 2012 107 109 A1, how to create with an air delivery element during the operation of the motor an axial air volume flow for the active cooling of the components, especially the motor electronics, this flow being conducted through a cooling air duct in the electronics housing. The air volume flow is usually taken in axially at the electronics housing and blown out radially. It has been found in the case of outdoor use that solids such as foliage and leaves are sucked in along with air, clogging the cooling air duct and reducing the cooling power. Protective grills known from the prior art are unsuitable for solving the problem, since they provide for only one suction direction and thus can also be clogged with foliage, leaves, and the like. Then no further intake of cooling air is possible.

Therefore, the problem which the present disclosure proposes to solve is the providing of a diversified-use cover device for an electric motor with electronics housing, which protects an electronics housing opening for taking in cooling air against becoming clogged with solids. Moreover, the problem which the present disclosure solves is to provide an electric motor whose cooling in outdoor use is assured in permanent manner.

This problem is solved by the combination of features according to patent claims 1 and 14.

According to the present disclosure, a cover device for an electronics housing of an electric motor is proposed which comprises at least one base segment and at least one rib formed on the base segment, wherein the base segment is geometrically configured so as to cover at least part of the surface of an electronics housing opening for drawing in a cooling air volume flow in order to close the electronics housing opening at least for a portion against the intrusion of solids. The base segment forms with the at least one rib at least one flow duct, which can be fluidically connected to the electronics housing opening, and wherein the cover device is designed as a modular insert for the electronics housing (2).

The base segment covers the surface of the electronics housing opening unlike traditional protective grills, yet with the at least one rib on the base segment it affords a constantly open flow duct for drawing cooling air into the electronics housing opening and hence into a cooling duct in the electronics housing.

In one advantageous embodiment, the at least one flow duct extends perpendicular to the suction direction, which is determined by the orientation of the electronics housing opening. Usually the suction occurs in an axial direction parallel to the axis of rotation of the electric motor. The at least one flow duct then extends preferably in the radial direction. When solids such as foliate fall axially onto the electronics housing opening and the cover device, the suctioning of cooling air occurs in the radial direction through the at least one flow duct. In one favorable embodiment, several ribs are formed on the base segment as axial ribs, each time forming a flow duct with the surface of the base segment. The base segment thus covers the electronics housing opening with a first side and forms the flow ducts with the opposite surface side together with the axial ribs.

In a further variant embodiment, the cover device is formed from a base segment and an axially spaced apart cover segment, while between the base segment and the cover segment there extend the axially spaced apart ribs, which also in the embodiment with base and cover segment form the flow ducts between them, being are fluidically connected to the electronics housing opening. The design of the cover device with base segment and cover segment affords the benefit of a defined bearing surface for contaminants such as foliage, leaves, or the like on the cover segment, while at the same time one or more flow ducts are assured between the base segment and cover segment. Furthermore, the flow can be optimized by the geometry of the flow ducts. The cover device therefore serves as an air guide element for a defined cooling.

In one sample embodiment, the cover device is annular in shape. In one modification, at least the base segment of the cover device is conically shaped and thus affords a nozzle-like air guidance radially inward to the electronics housing opening.

Moreover, a design is conceivable in which the cover segment is arranged with an inward radial offset relative to a radial outer rim of the base segment. The air inlet between base segment and cover segment at the radial outer rim is increased in this way. Furthermore, embodiments are included in which the cover segment does not overlap entirely in a projection of the base segment, so that the ribs or axial ribs have free axial end faces, i.e., not covered by the cover segment. The ribs or axial ribs extend here in the radial direction radially inward beyond a radial inner rim of the cover disk. In this way, two inflow directions radially and axially along the ribs or axial ribs can be provided by the cover device itself. So long as two inflow directions are given, the direction of installation of the electric motor is no longer important, since a fouling with foliage, leaves and the like under the action of gravity usually occurs only on one side.

Moreover, it is favorable for the ribs or axial ribs to have a radial outer edge, which directly joins the radial outer rim of the base segment and a radial outer rim of the cover segment. The radial outer edges thus form a lattice-like radial closure between the base segment and cover segment.

In one sample embodiment, the ribs or axial ribs are flush with the radial outer rim of the base segment and/or flush with the radial outer rim of the cover segment. In this way, no regions of the ribs or axial ribs remain on the cover device in which contaminants could get trapped. Instead, contaminants lying thereon can be removed once again by the wind, for example.

In one modification it is furthermore provided that the ribs or axial ribs of the cover device run in a straight line radially outward. Furthermore, an axial spacing between the base segment and the cover segment is advantageously constant, so that the base segment and the cover segment run at least substantially parallel.

According to the present disclosure, the cover device is designed as a modular insert for the electronics housing, so that it can be installed, retrofitted, or replaced in diversified manner. In particular, this enables the use of certain cover devices for different installation positions of the electric motor, such as horizontal or vertical.

The cover device is preferably designed as a single piece. In particular, the base segment and the ribs or axial ribs are a single piece. In one design with base segment and cover segment, a one-piece design is likewise preferred. However, the cover device can also be assembled from several peripheral segments.

The present disclosure moreover encompasses an electric motor, which comprises an electronics housing with motor electronics housed therein, wherein the electronics housing has an integrated cooling air duct extending at least in the axial direction past the motor electronics, through which the cooling air volume flow can be delivered and which ends at the electronics housing opening. The above-described cover device is secured to the electric motor, so that the electronics housing opening remains constantly open and protected against becoming clogged with solids. The air volume flow can constantly be drawn into the cooling air duct via the cover device and the electronics housing opening.

In one variant embodiment, it is provided on the electric motor that the electronics housing opening of the electronics housing is formed by cooling ribs. Furthermore, the ribs or axial ribs of the cover device extend parallel and/or in radial prolongation flush with the cooling ribs of the electronics housing. The axial ribs of the cover device in one favorable [embodiment] are arranged butting against the ribs of the electronics housing.

The electronics housing opening in one embodiment has a radial opening segment, which is oriented perpendicular to the axis of rotation of the electric motor. The radial opening segment is preferably fluidically connected directly to the flow duct of the cover device, in order to enable a suctioning of cooling air in a direction perpendicular to the axis of rotation of the electric motor.

The cover device in one embodiment bears with the base segment against the axial end faces of the cooling ribs of the electronics housing. The axial ribs of the cover device can be configured in a predefined shape and extension in order to cooperate in the best possible fluidic manner with the electronics housing opening. For example, the axial ribs can narrow the flow ducts in the direction toward the electronics housing opening, in order to increase the flow velocity of the air volume flow drawn in. Thus, the cover device can serve not only as protection against fouling, but also as a flow guidance element toward the electronics housing opening.

Basically all features disclosed can be combined in any way desired, so long as this is technically possible. Where the present document speaks of "radial", the corresponding features also are deemed to be disclosed at the same time for non-round components, and then they pertain, mutatis mutandis, to the circumferential dimension.

Other advantageous modifications of the invention are characterized in the subclaims or presented more closely below together with the description of the preferred embodiment of the present disclosure by means of the figures. There are shown:

BRIEF DESCRIPTION OF THE DRAWINGS

The figures show different sample embodiments of the invention, the same reference numbers designated the same parts.

DETAILED DESCRIPTION OF SPECIFIC EMBODIMENTS

Figure 1:
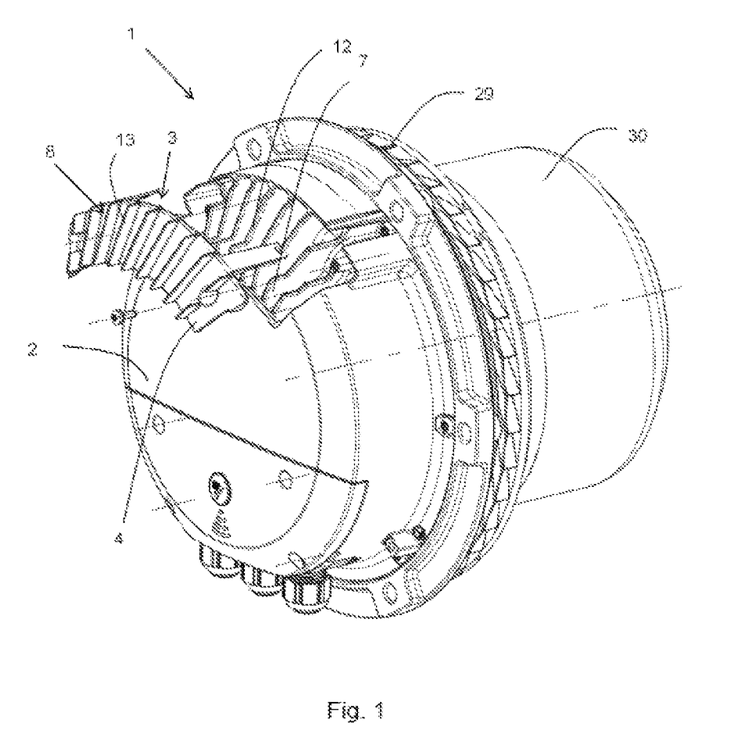
FIG. 1 a perspective view of an electric motor, partly in exploded view.
Figure 2:
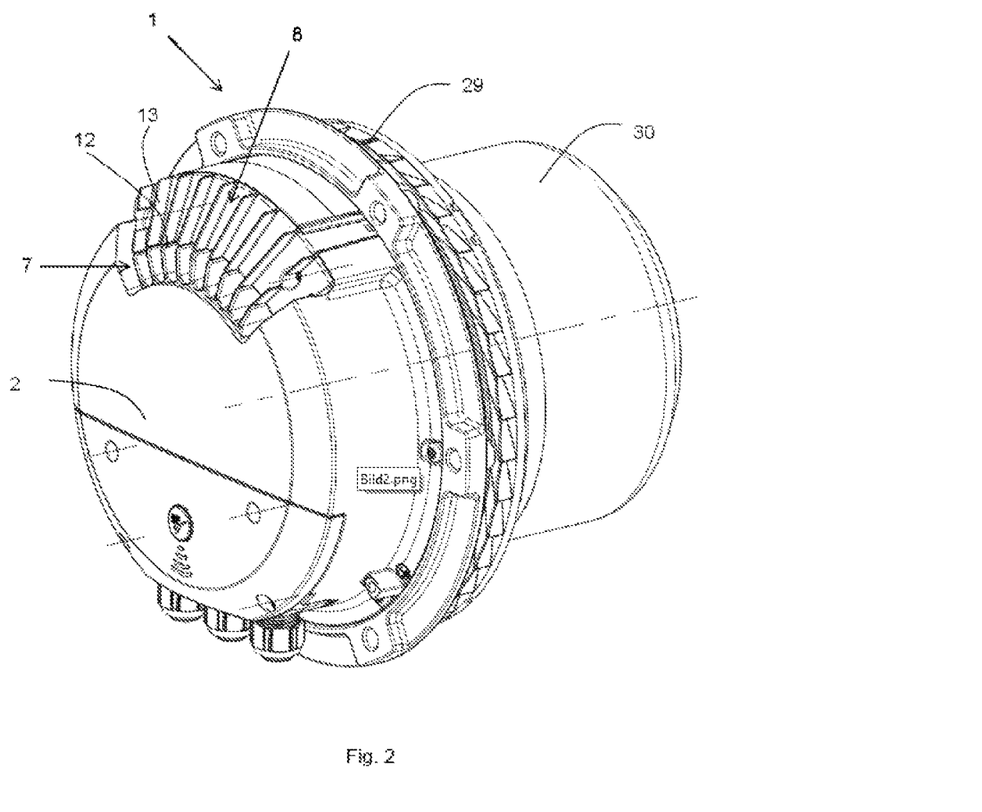
FIG. 2 the electric motor of FIG. 1 in the mounted state.
Figure 3:
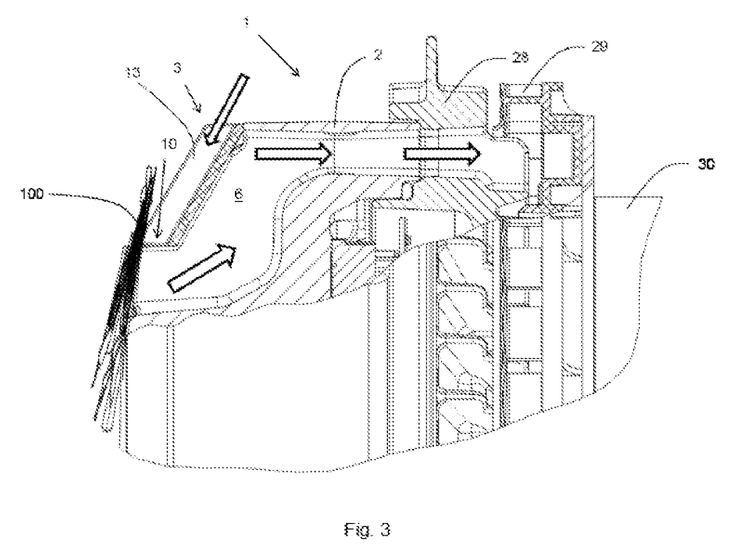
FIG. 3 a cutout of a sectional side view of the electric motor of FIG. 2.

FIGS. 1 to 3 show in a first sample embodiment an electric motor 1 with an electronics housing 2 and an axially attached stator bushing 28 with rotor 30. Between the electronics housing 2 and the rotor 30 is disposed an impeller 29, which during the operation of the motor creates an air volume flow flowing in the axial direction through the cooling air duct 6 integrated in the electronics housing 2 for the cooling of the motor electronics housed in the electronics housing 2. The cooling air duct 6 extends as far as the axial electronics housing opening 7 in the axial end segment of the electronics housings 2. The cover device 3 is arranged on the outside of the electronics housing 2 bounding off the axial electronics housing opening 7 and partly covering it. The cover device 3 is fashioned as a ring segment and has several axial ribs 13 running straight in the radial direction, forming radial flow ducts 8 between them. The cover device 3 in FIG. 2 is screwed onto the electronics housing 2, the radial opening segment 10 of the electronics housing opening 7 being fluidically connected to the radial flow ducts 8. The electronics housing opening 7 of the electronics housing 2 is formed by cooling ribs 12 fashioned on the electronics housing 2. The cooling ribs 12 are spaced apart in the circumferential direction and extend as flat, level plate bodies in the axial and radial direction.

The cover device 3 comprises, as the base body of the ring segment, a base segment 4 fashioned as a bottom plate, on whose top side are fashioned as a single piece the axial ribs 13 running as straight lines in the radial direction. The cover device 3 is fully in contact with axial end faces of the cooling ribs 12 of the electronics housing 2. The axial ribs 13 of the cover device 3 extend in a radial prolongation flush with and butting against the cooling ribs 12 of the electronics housing 2, so that the flow ducts 8 of the cover profile 3 pass directly into the radial opening segment 10 of the electronics housing opening 7 formed by the cooling ribs 12.

FIG. 3 shows as an example a fouling of the axial side of the duct entrance 7 of the design per FIG. 2 with foliage 100, so that the inflow of the air volume flow indicated by arrows into the cooling air duct 6 occurs primarily from the radial direction through the flow ducts 8 of the cover device 3.

Figure 4:
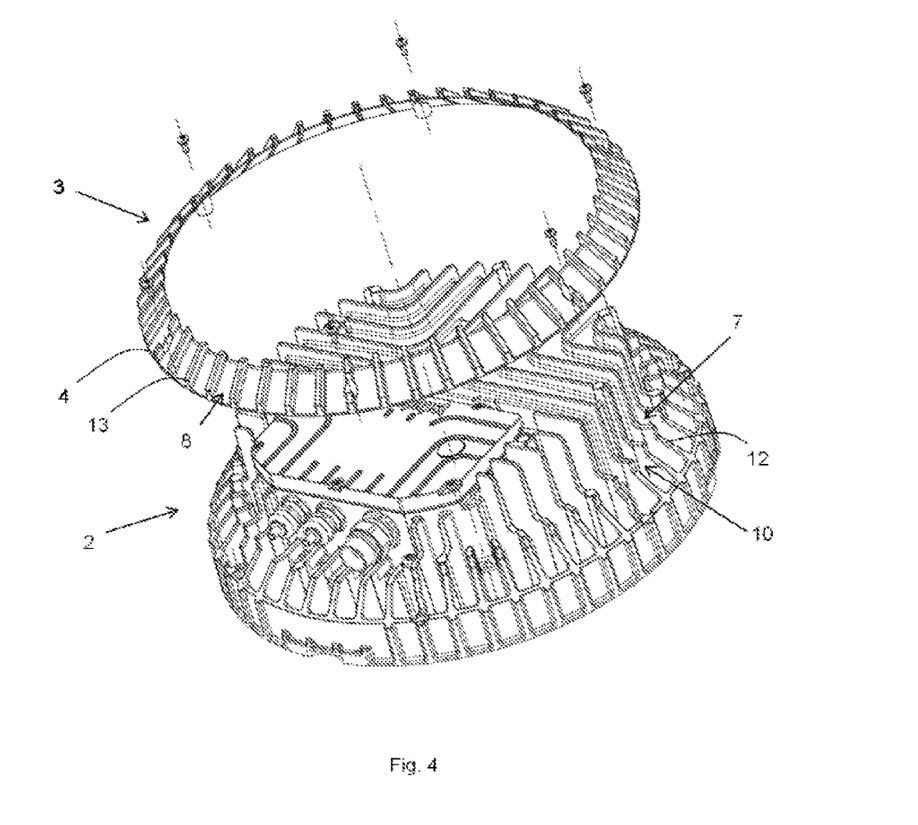
FIG. 4 a perspective view of an electronics housings, partly in exploded view, in an alternative embodiment.

FIG. 4 shows a first alternative sample embodiment of an electronics housings 2 with cover device 3 in exploded view. The cover device 3 in terms of its features corresponds to the design of FIG. 1, but in contrast with FIG. 1 it is fashioned as a closed ring, brought to bear by its entire circumference against the cooling ribs 12 of the electronics housing 2. The cooling ribs 12 at their end face have a complementary shape to the conically tapering base segment 4 of the cover device 3. In this embodiment as well, the axial ribs 13 extend in a prolongation and parallel to the cooling ribs 12 of the electronics housing 2, so that the flow ducts 8 of the cover profile 3 pass directly into the radial opening segment 10 of the electronics housing opening 7 formed by the cooling ribs 12. The cooling air duct 6 in this embodiment surrounds the entire electronics housing 2 in the circumferential direction. Moreover, the cooling ribs 12 of the electronics housings 2 extend in the axial direction further beyond the electronics housing opening 7 as far as the axial end segment of the electronics housing 2. They form indentations on the outer surface of the electronics housings 2 and thereby enlarge the overall cooling area.

Figure 5:
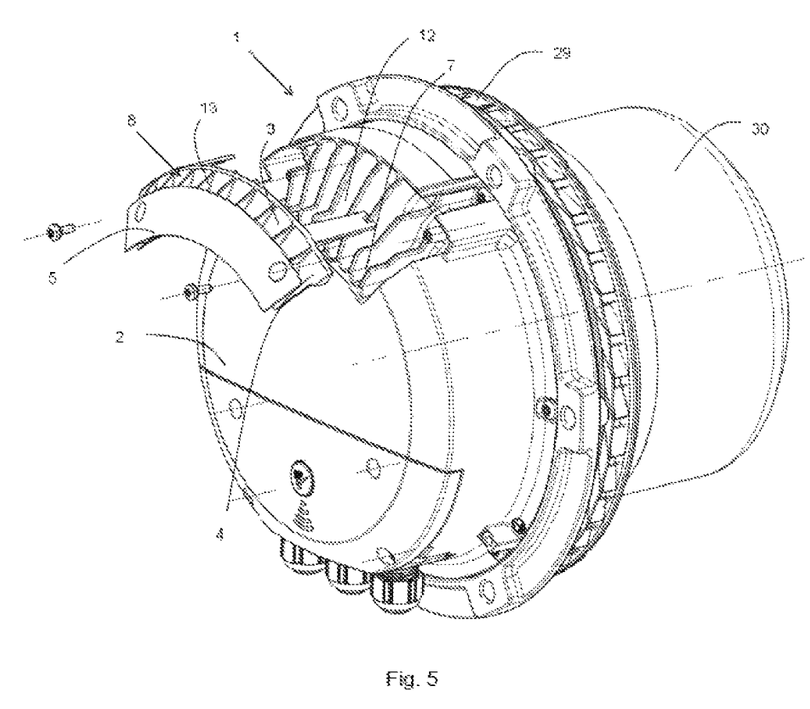
FIG. 5 a perspective view of an electric motor, partly in exploded view, in another alternative embodiment.
Figure 6:
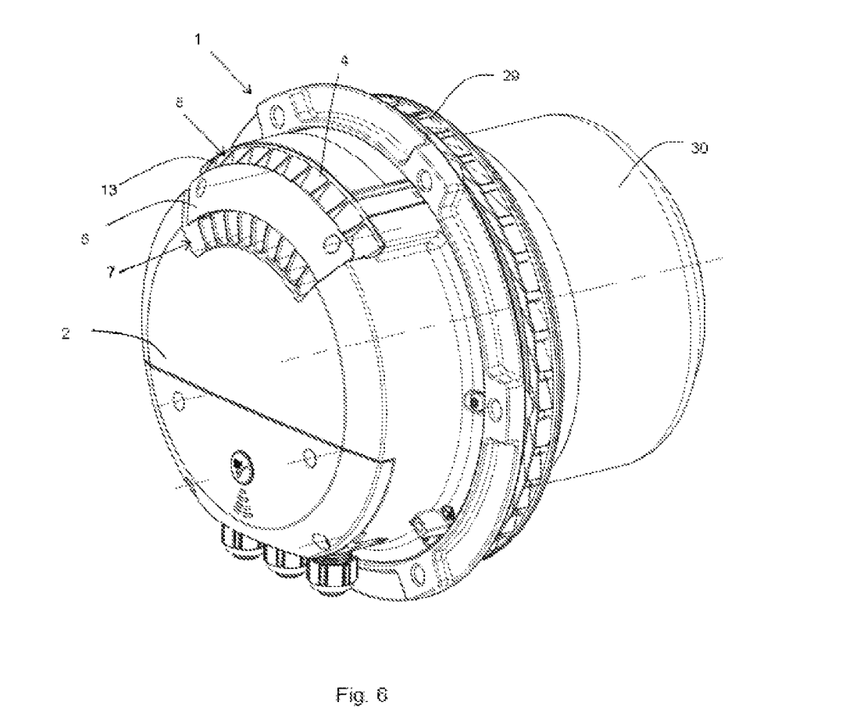
FIG. 6 the electric motor of FIG. 5 in the mounted state.

FIGS. 5 and 6 show another sample embodiment of the electric motor 1, wherein all features not concerning the cover device 3 are identical to the design of FIGS. 1 to 3 and also apply accordingly to this design.

The cover device 3 is an interchangeable modular component and comprises, in addition to the base segment 4, the cover segment 5, while between the base segment 4 and the cover segment 5 extend the spaced apart axial ribs 13, forming between them the radial flow ducts 8. The cover device 3 per FIG. 5 is a one-piece ring segment, which is screwed onto the electronics housing 2. The base segment 4 has a conically tapering cross section, being complementary to the end face of the cooling ribs 12. The cover segment 5 extends in the radial direction as far as the electronics housing opening 7, which is formed by the cooling ribs 12. As compared to the radial outer rim of the base segment 4, the cover segment 5 is arranged with an inward radial offset in regard to its radial outer rim. The axial ribs 13 run with their radial outer edges at a slant between the base segment 4 and the cover segment 5 and are flush with the radial outer rim of the base segment 4 and the radial outer rim of the cover segment 5. The axial spacing between the base segment 4 and the cover segment 5 is constant. When there is a fouling of the axial side of the electronics housing opening 7, the inflow occurs radially via the flow ducts 8 which are formed between the axial ribs 13 and the cover and base segment 5, 4.

Figure 7:
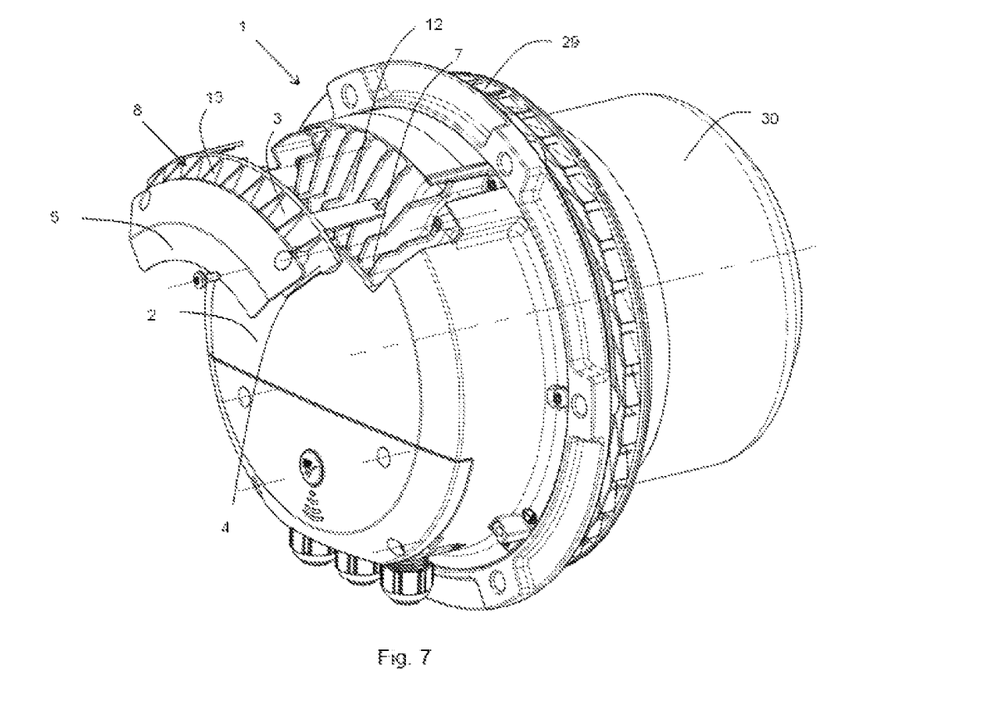
FIG. 7 a perspective view of an electric motor, partly in exploded view, in another alternative embodiment.
Figure 8:
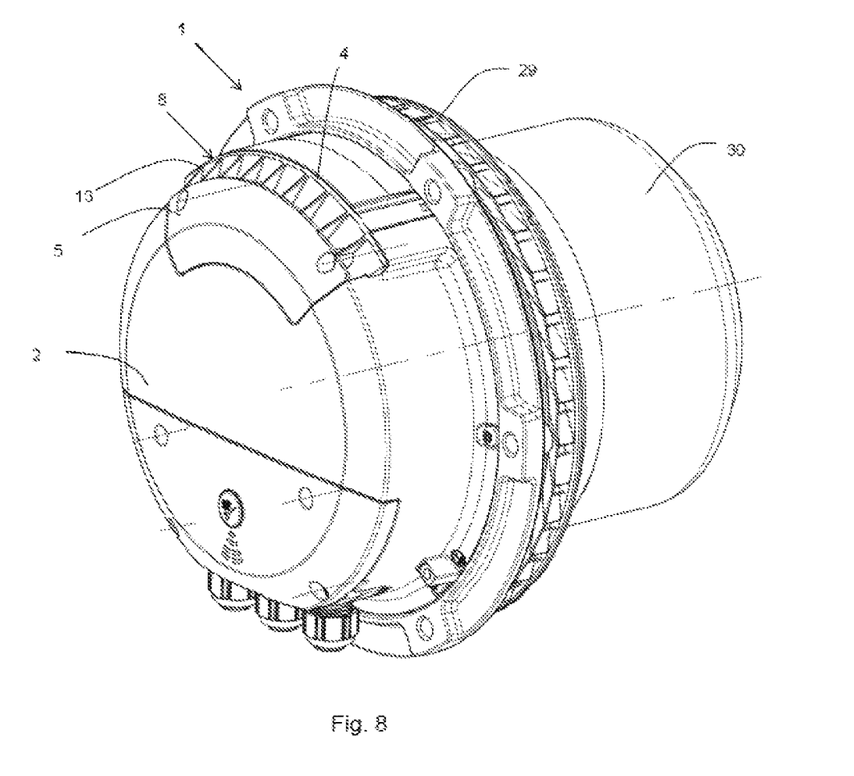
FIG. 8 the electric motor of FIG. 7 in the mounted state.

FIGS. 7 and 8 show another sample embodiment, which differs from the sample embodiment in FIGS. 5 and 6 in that the cover segment 5 of the cover device 3 entirely covers the electronics housing opening 7 and hence the cooling ribs 12 in the axial direction. This results in an exclusively radial inflow direction. Therefore, the design is suited to an installation direction of the electric motor in the vertical direction, so that foliage falling down comes to bear against the cover segment 5, but the radial flow ducts 8 remain always open. Otherwise, the features are identical to the design of FIG. 5 and the design of FIG. 7.

The invention is not limited in its embodiment to the preferred sample embodiments given above. Also encompassed are embodiments in which a cover device per FIG. 5 is fashioned as a complete circumferential ring per FIG. 4 and placed against ribs 12 of the electronics housing 2 over its entire circumference. The axial ribs 13 of the cover device can also extend in the radial direction radially inward beyond a radial inner rim of the cover segment 5 and be brought to bear against the ribs 12 of the electronics housing, or replace the outward axially free-standing segment of the cooling ribs 12.

In another variant embodiment not shown, the cover device is attached directly to the electronics housing 2 by material connection or as a single piece with a geometry according to the sample embodiments explained above. One example of this would be a complete pressure casting. In an alternative variant, the cover device is made from plastic.

The invention claimed is:

1. A cover device for an electronics housing of an electric motor with a base segment and at least one rib formed on the base segment, wherein the base segment is geometrically configured so as to cover at least part of a surface of an electronics housing opening for drawing in a cooling air volume flow in order to close the electronics housing opening at least for a portion against intrusion of solids, and the base segment forms with the at least one rib at least one flow duct, which can be fluidically connected to the electronics housing opening, and wherein the cover device is designed as a modular insert for the electronics housing, wherein several ribs are formed on the base segment as axial ribs, each time forming a flow duct with a surface of the base segment, and wherein the at least one rib includes several ribs that run at a slant radially inward, so that several flow ducts between the several ribs taper in the radially inward direction.

2. The cover device according to claim 1, wherein the at least one flow duct runs perpendicular to a suction direction.

3. The cover device according to claim 1, wherein the cover device is formed from the base segment and a cover segment, while between the base segment and the cover segment there extends the at least one rib, and the at least one rib, the base segment and the cover segment form the at least one flow duct.

4. The cover device according to claim 1, wherein the cover device is in a shape of a ring or a partial ring.

5. The cover device according to claim 1, wherein the base segment is conical in shape.

6. The cover device according to claim 3, wherein the cover segment is arranged with an inward radial offset relative to a radial outer rim of the base segment.

7. The cover device according to claim 6, wherein the at least one rib has a radial outer edge, which directly joins a radial outer rim of the base segment and a radial outer rim of the cover segment.

8. The cover device according to claim 7, wherein at least one rib is flush with the radial outer rim of the base segment and/or flush with the radial outer rim of the cover segment.

9. The cover device according to claim 3, wherein the at least one rib extends radially inward in the radial direction beyond a radial inner rim of the cover segment.

10. The cover device according to claim 1, wherein the cover device is designed as one piece.

11. Use of the cover device according to claim 1, on the electronics housing of the electric motor.

12. An electric motor, comprising an electronics housing with motor electronics housed therein, wherein the electronics housing has an integrated cooling air duct extending at least in an axial direction past the motor electronics, through which a cooling air volume flow can be delivered and which ends at the electronics housing opening, wherein the cover device according to claim 1 can be fastened to the electronics housing opening.

13. The electric motor according to claim 12, wherein the electronics housing opening is formed by cooling ribs, and the at least one rib of the cover device extend parallel and/or in radial prolongation to the cooling ribs of the electronics housing.

14. The electric motor according to claim 13, wherein the electronics housing opening has a radial opening segment, which is oriented perpendicular to an axis of rotation of the electric motor, wherein the radial opening segment is fluidically connected directly to the flow duct of the cover device.

15. The electric motor according to claim 12, wherein the base segment is fully in contact with axial end faces of the cooling ribs of the electronics housing.

* * * * *